(12) United States Patent
Gardner et al.

(10) Patent No.: US 6,420,730 B1
(45) Date of Patent: Jul. 16, 2002

(54) ELEVATED TRANSISTOR FABRICATION TECHNIQUE

(75) Inventors: Mark I. Gardner, Cedar Creek; Daniel Kadosh; Michael Duane, both of Austin, all of TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/591,871

(22) Filed: Jun. 12, 2000

Related U.S. Application Data

(60) Continuation of application No. 09/136,177, filed on Aug. 19, 1998, now Pat. No. 6,075,258, which is a division of application No. 08/873,116, filed on Jun. 11, 1997, now Pat. No. 5,834,350.

(51) Int. Cl.⁷ ............................................. H01L 29/76
(52) U.S. Cl. ........................................... 257/67; 257/74
(58) Field of Search ........................................ 257/67, 74

(56) References Cited

U.S. PATENT DOCUMENTS

| | | | |
|---|---|---|---|
| 3,791,024 A | 2/1974 | Boleky, III | |
| 4,654,121 A | 3/1987 | Miller et al. | |
| 4,679,299 A | 7/1987 | Szluk et al. | |
| 4,868,137 A | 9/1989 | Kubota | |
| 4,889,829 A | 12/1989 | Kawai | |
| 5,418,393 A | 5/1995 | Hayden | |
| 5,714,394 A | 2/1998 | Kadosh et al. | |
| 5,728,619 A | 3/1998 | Tsai et al. | |
| 5,731,217 A | 3/1998 | Kadosh et al. | |
| 5,747,367 A | 5/1998 | Kadosh et al. | |
| 5,770,482 A | 6/1998 | Kadosh et al. | |
| 5,770,483 A | 6/1998 | Kadosh et al. | |
| 5,808,319 A | 9/1998 | Gardner et al. | |
| 5,818,069 A | 10/1998 | Kadosh et al. | |
| 5,834,350 A | 11/1998 | Gardner et al. | |
| 5,834,354 A | 11/1998 | Kadosh et al. | |
| 5,841,175 A | 11/1998 | Sugiura et al. | |
| 5,852,310 A | 12/1998 | Kadosh et al. | |
| 5,863,818 A | 1/1999 | Kadosh et al. | |
| 5,872,029 A | 2/1999 | Gardner et al. | |
| 5,882,959 A | 3/1999 | Kadosh et al. | |
| 5,888,872 A | 3/1999 | Gardner et al. | |
| 5,926,700 A | 7/1999 | Gardner et al. | |
| 6,025,633 A | 2/2000 | Kadosh et al. | |
| 6,075,258 A | * 6/2000 | Gardner et al. | ............... 257/67 |
| 6,075,268 A | 6/2000 | Gardner et al. | |

FOREIGN PATENT DOCUMENTS

JP 60-186051 9/1985

\* cited by examiner

*Primary Examiner*—Mark V Prenty
(74) *Attorney, Agent, or Firm*—Kevin L. Daffer; Conley, Rose & Tayon P.C.

(57) ABSTRACT

A second transistor is formed a spaced distance above a first transistor. An interlevel dielectric is first deposited upon the upper surface of the first semiconductor substrate and the first transistor. A second semiconductor substrate, preferably comprising polysilicon, is then formed into the interlevel dielectric. A second transistor is then formed on the upper surface of the second semiconductor substrate. The second transistor is a spaced distance above the first transistor. The two transistors are a lateral distance apart which is smaller than the distance that can be achieved by conventional fabrication of transistors on the upper surface of the wafer. Transistors are more closely packed which results in an increase in the number of devices produced per wafer.

7 Claims, 3 Drawing Sheets

ELEVATED TRANSISTOR FABRICATION TECHNIQUE

This application is a continuation of application Ser. No. 09/136,177 filed Aug. 19, 1998, now U.S. Pat. No. 6,075,258, which was a divisional of application Ser. No. 08/873,116 filed Jun. 11, 1997, now U.S. Pat. No. 5,834,350.

BACKGROUND OF THE INVENTION

1. Field of the Invention

This invention relates to the field of semiconductor processing and, more particularly, to an integrated circuit and method of making same, wherein a transistor is fabricated a spaced distance above another transistor to produce a higher density of active devices on a wafer.

2. Description of Relevant Art

Fabrication of a metal-oxide-semiconductor ("MOS") transistor is well-known. Fabrication typically begins by introducing f-type or p-type impurities into a single-crystal silicon substrate. The active regions of the substrate (where the transistors will be formed) are then isolated from each other using isolation structures. In modern fabrication technologies, the isolation structures may comprise shallow trenches in the substrate filled with a dielectric such as oxide which acts as an insulator. Isolation structures may alternatively comprise, for example, locally oxidized silicon ("LOCOS") structures. A gate dielectric is then formed by oxidizing the silicon substrate. Oxidation is generally performed in a thermal oxidation furnace or, alternatively, in a rapid-thermal-anneal ("RTA") apparatus. A gate conductor is then patterned using a photolithography/etch process from a layer of polycrystalline silicon ("polysilicon") deposited upon the gate dielectric. The photolithography process allows selective removal of a photoresist film deposited entirely across the polysilicon. The portion of the photoresist film that is exposed can, according to one embodiment, be polymerized, and that which is not exposed removed during the "develop" stage of the lithography process. The regions that are non-polymerized form a mask for a subsequent etch during which portions of the polysilicon layer that are not masked by the photoresist pattern are removed. After the etch process, the patterned photoresist layer is stripped away.

In the sub micron range, it is very critical to produce gate conductors with substantially vertical sidewalls. The width of the gate conductor determines the channel length of the device, which is very critical to the performance of the device. This is insignificant for devices with longer channel lengths but more critical for submicron devices. It is difficult to produce a polysilicon gate conductor with substantially vertical sidewalls. Sloped sidewalls are common resulting in longer channel lengths.

The polysilicon is typically rendered conductive with the introduction of ions from an implanter or a diffusion furnace. Subsequently, source and drain regions are doped with a high-dose n-type or p-type dopant If the source and drain regions are doped n-type, the transistor is refer to as NMOS, and if the source and drain regions are doped p-type, the transistor is referred to as PMOS. A channel region between the source and the drain is protected from the implant species by the pre-existing gate conductor. When an appropriate bias is applied to the gate of an enhancement-mode transistor, a conductive channel between the source and drain is induced and the transistor turns on.

Because of the increased desire to build faster and more complex integrated circuits, it has become necessary to form relatively small, closely spaced transistors within a single integrated circuit. Unfortunately, since transistors are generally formed within the silicon-based substrate of an integrated circuit, the number of transistors per integrated circuit is limited by the available lateral area of the substrate. Moreover, transistors cannot employ the same portion of a substrate, and increasing the area occupied by the substrate is an impractical solution to this problem. Thus, packing density of an integrated circuit is somewhat sacrificed by the common practice of forming transistors exclusively within a substrate having a limited amount of area. Having more densely packed transistors would result in an increase in the number of devices, such as central processing units, memory chips, etc., formed on each wafer.

It would therefore be desirable that a semiconductor fabrication process be developed for the formation of more densely packed transistors. Such a process would lead to an increase in circuit speed as well as an increase in circuit complexity.

SUMMARY OF THE INVENTION

The problems identified above are in large part addressed by a semiconductor process in which a second transistor is formed a spaced distance above a first transistor. An interlevel dielectric is first deposited upon the upper surface of the first semiconductor substrate and the first transistor. A second semiconductor substrate, preferably comprising polysilicon, is then formed into the interlevel dielectric. A second transistor is then formed on the upper of the second semiconductor substrate. The second transistor is a spaced distance above the first transistor. The two transistors are a lateral distance apart which is smaller than the distance that can be achieved by conventional fabrication of transistors on the upper surface of the wafer. Transistors are more closely packed which results in an increase in the number of devices produced per wafer.

Broadly speaking the present invention contemplates a method for fabricating an integrated circuit. A first semiconductor substrate is provided. A first transistor is formed upon the first semiconductor substrate. An interlevel dielectric is deposited upon the first semiconductor substrate and the first transistor. A second semiconductor substrate is formed within the interlevel dielectric. The second semiconductor substrate is laterally and vertically displaced from the first transistor.

A polish-stop layer is deposited upon the interlevel dielectric and the second semiconductor substrate. A portion of the polish-stop layer is removed to form a trench and expose a portion of an upper surface of the second semiconductor substrate. A second gate dielectric layer is formed upon the upper surface of the second semiconductor substrate. A conductive material is deposited within the trench to form a second gate conductor.

The remaining portion of the polish-stop layer may then be removed to expose the second gate conductor. A second concentration of dopants is introduced into the second semiconductor substrate to form a second pair of source/drain regions.

The step of introducing a second concentration of dopants preferably comprises implanting a light concentration of dopants to form a lightly doped portion of the second pair of source/drain regions. A second set of spacers is formed upon a second set of sidewalls of the second gate conductor. A high concentration of dopants is then implanted to form a highly doped portion of the second pair of source/drain regions. A lateral distance of the second pair of source/drain regions from the second gate conductor is defined by the second set of spacer structures.

The first semiconductor substrate comprises a lightly-doped, epitaxial layer of single-crystalline silicon. The step of depositing an interlevel dielectric comprises depositing tetraethyl orthosilicate or silane using chemical-vapor deposition. The interlevel dielectric may be further doped with boron and/or phosphorous.

The step of forming a second semiconductor substrate comprises first etching a trench void into an upper surface of the interlevel dielectric. Polysilicon is then deposited within the trench void, exterior to the trench void, and upon the upper surface of the interlevel dielectric. The polysilicon is then removed from an upper surface of the interlevel dielectric and exterior to the trench void using a chemical-mechanical polish method. An upper surface of the polysilicon, after partial removal, is at the same level as the upper surface of the interlevel dielectric.

The step of depositing the polish-stop layer comprises depositing a layer of tetraethyl orthosilicate or nitride using chemical-vapor deposition. The step of forming a second gate dielectric layer comprises thermally oxidizing the second semiconductor substrate to a thickness of approximately 15–50 angstroms. The step of depositing a conductive material comprises first depositing polysilicon within the trench, upon the upper surface of the polish-stop layer, and exterior to the trench. Polysilicon is then removed from upon the upper surface of the polish-stop layer and exterior to the trench using chemical-mechanical polishing. An upper surface of the polysilicon after partial removal is at the same level as the upper surface of the polish-stop layer.

The present invention further contemplates an integrated circuit. A first transistor is formed upon a first semiconductor substrate. An interlevel dielectric is formed upon the first semiconductor substrate and the first transistor. A second semiconductor substrate is formed within the interlevel dielectric. The second semiconductor substrate is laterally and vertically displaced from the first transistor. A second gate dielectric is formed upon the upper surface of the second semiconductor substrate. A second gate conductor is formed upon the second gate dielectric layer. The second gate conductor is formed by first depositing a polish-stop layer upon the interlevel dielectric and the second semiconductor substrate. A portion of the polish-stop layer is then removed to form a trench and expose a portion of the upper surface of the second semiconductor substrate. A conductive material is deposited within the trench to form the second gate conductor.

The integrated circuit further comprises a second pair of source/drain regions. The second pair of source/drain regions preferably comprises a lightly-doped portion and a highly doped portion. The first semiconductor substrate preferably comprises a lightly-doped epitaxial layer of single-crystalline silicon.

The first transistor preferably comprises a first dielectric layer formed upon the upper surface of the first semiconductor substrate. A first gate conductor is formed upon the first dielectric layer. A first set of spacers is formed upon a first set of sidewall surfaces of the first gate conductor. A first pair of source/drain regions comprises lightly-doped portions and highly-doped portions.

The interlevel dielectric preferably comprises tetraethyl orthosilicate or silane deposited using chemical-vapor deposition. The interlevel dielectric may further comprise boron and/or phosphorous. The second semiconductor substrate preferably comprises polysilicon. The polish-stop layer preferably comprises a layer of tetraethyl orthosilicate or nitride deposited using chemical-vapor deposition. The second gate dielectric layer preferably comprises an oxide formed by thermally oxidizing the second semiconductor substrate to a thickness of approximately 15–50 angstroms. The conductive material preferably comprises polysilicon.

BRIEF DESCRIPTION OF THE DRAWINGS

Other objects and advantages of the invention will become apparent upon reading the following detailed description and upon reference to the accompanying drawings in which.

Figure 1:
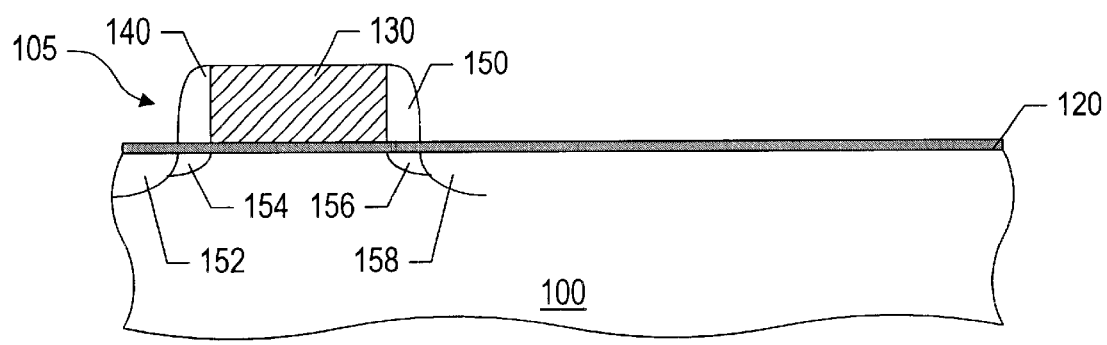
FIG. 1 is a partial cross-sectional view of a first semiconductor substrate, wherein a first transistor is formed upon the a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the figures, FIG. 1 shows a partial cross-sectional view of semiconductor substrate 100. Semiconductor substrate 100 preferably comprises an epitaxial layer of lightly-doped f-type or p-type single crystalline silicon. This lightly-doped epitaxial layer is formed upon a heavily-doped single-cystalline silicon. First transistor 105 is then formed upon first semiconductor substrate 100. First transistor 105 comprises gate dielectric layer 120 formed upon the upper surface of first semiconductor substrate 100. First gate conductor 130 is formed upon gate dielectric layer 120. Spacer structures 140 and 150 are formed upon the sidewall surfaces of gate conductor 130. Source/drain regions are formed on either side of gate conductor 130. The source/drain regions comprise lightly-doped portions 154 and 156 and highly-doped portions 152 and 158.

Figure 2:
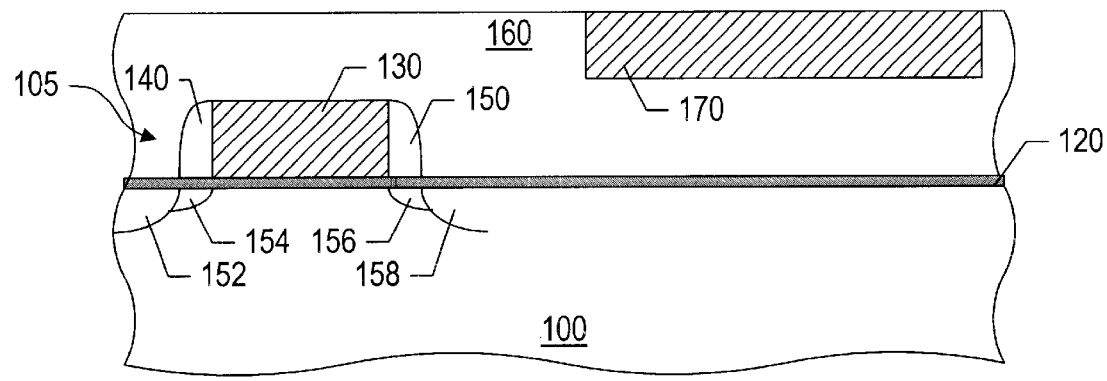
FIG. 2 is a partial cross-sectional view of a semiconductor substrate according to a processing step subsequent to FIG. 1, wherein an interlevel dielectric is formed upon the first transistor and the semiconductor substrate and wherein a second semiconductor substrate is formed within the interlevel dielectric.

Turning now to FIG. 2, interlevel dielectric 160 is deposited upon first transistor 105 and upon the upper surface of the first semiconductor substrate 100. In a preferred embodiment, interlevel dielectric 160 comprises primarily oxide. In an alternative embodiment, tetraethyl orthosilicate (TEOS) doped with boron and phosphorous may also be used.

Second semiconductor substrate 170 is subsequently formed. A trench void is first etched into the upper surface of interlevel dielectric 160. The trench void is laterally and vertically spaced from the first transistor 105. The trench void is preferably anisotropically etched to produce a trench with substantially vertical sidewalls. In a preferred embodiment, polysilicon is then deposited within the trench void, exterior to the trench void, and upon the upper surface of interlevel dielectric 160. Any polysilicon that is exterior to the trench is subsequently removed preferably using a chemical-mechanical polish method (CMP). After the CMP, the upper surface of the second semiconductor substrate 170 is substantially planar.

An optional well implant may then be performed to increase the electrical conductivity of second semiconductor substrate 170. If an n-type transistor is to be formed, a p-well is formed. If a p-type transistor is to be formed, an n-well is formed in second semiconductor substrate 170. If necessary, a threshold adjust implant may also be performed to ensure that the threshold voltage is within the design specifications.

Figure 3:
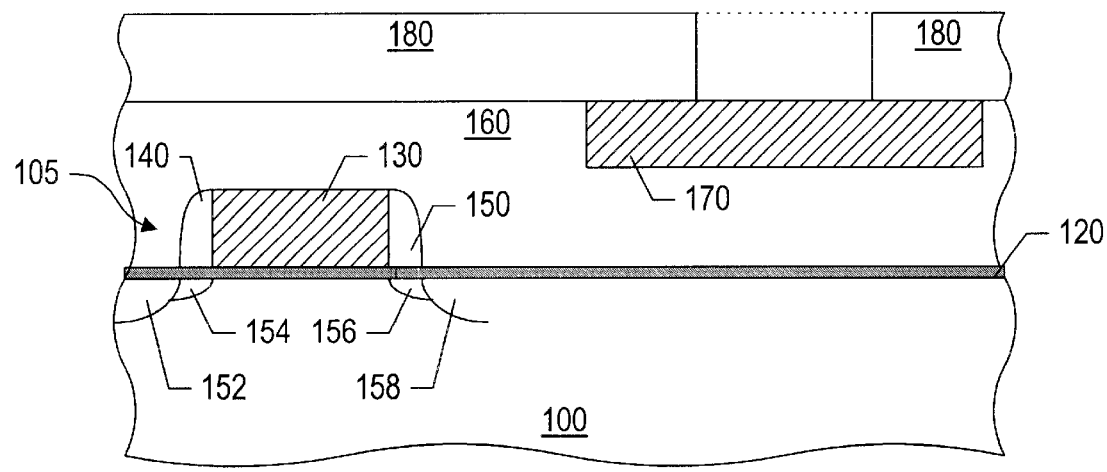
FIG. 3 is a partial cross-sectional view of a semiconductor substrate according to a processing step subsequent to FIG. 2, wherein a polish stop layer is formed upon the interlevel dielectric and wherein the second semiconductor substrate is patterned to expose a portion of the upper surface of the second semiconductor substrate.

Turning now to FIG. 3, polish-stop layer 180 is deposited upon the upper surface of interlevel dielectric 160 and the upper surface of second semiconductor substrate 170. Polish-stop layer 180 preferably comprises TEOS deposited using chemical-vapor deposition (CVD). A trench void is subsequently etched into region of polish-stop layer 180 expose a portion of the upper surface of second semiconductor substrate 170. In a preferred embodiment, an anisotropic etch is used to produce a trench with substantially vertical sidewalls.

Figure 4:
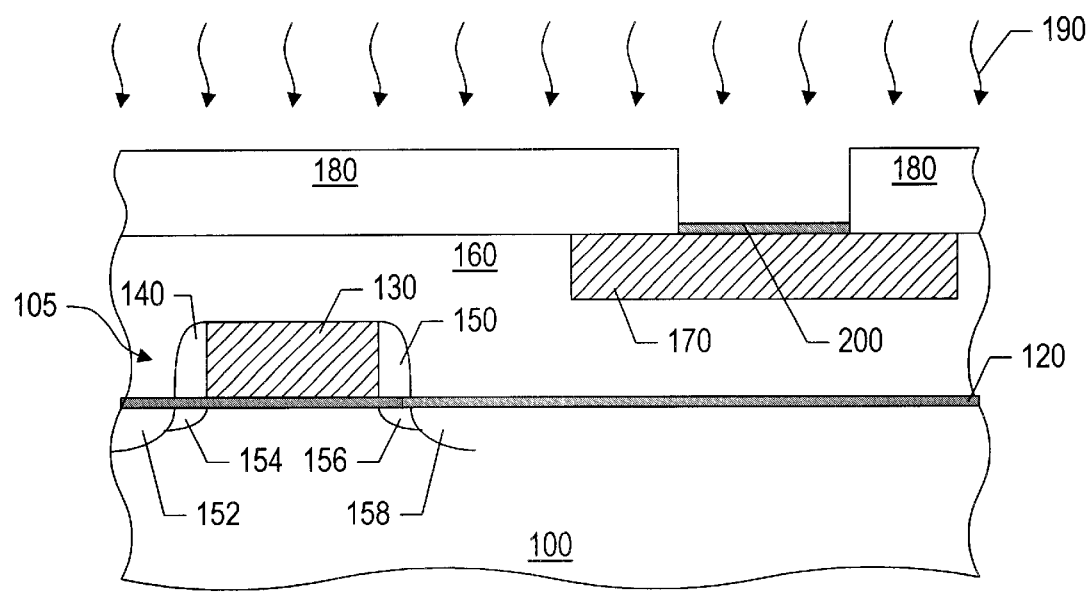
FIG. 4 is a partial cross-sectional view of a semiconductor substrate according to a processing step subsequent to FIG. 3, wherein a gate dielectric is grown upon the upper surface of the second semiconductor substrate using a thermal anneal.

Turning now to FIG. 4, second gate dielectric 200 is grown upon the exposed portion of the upper surface of second semiconductor substrate 170. Gate dielectric layer 200 is grown by a thermal oxidation process. The thermal oxidation may be performed in a thermal oxidation furnace, or alternatively, in a rapid thermal anneal apparatus. In a rapid thermal anneal apparatus, the semiconductor topography is subjected to a temperature of approximately 700–10000° C. for a relatively short time (typically less than 20 minutes). The thickness of second gate dielectric layer 200 is preferably between 15 and 50 angstroms.

Figure 5:
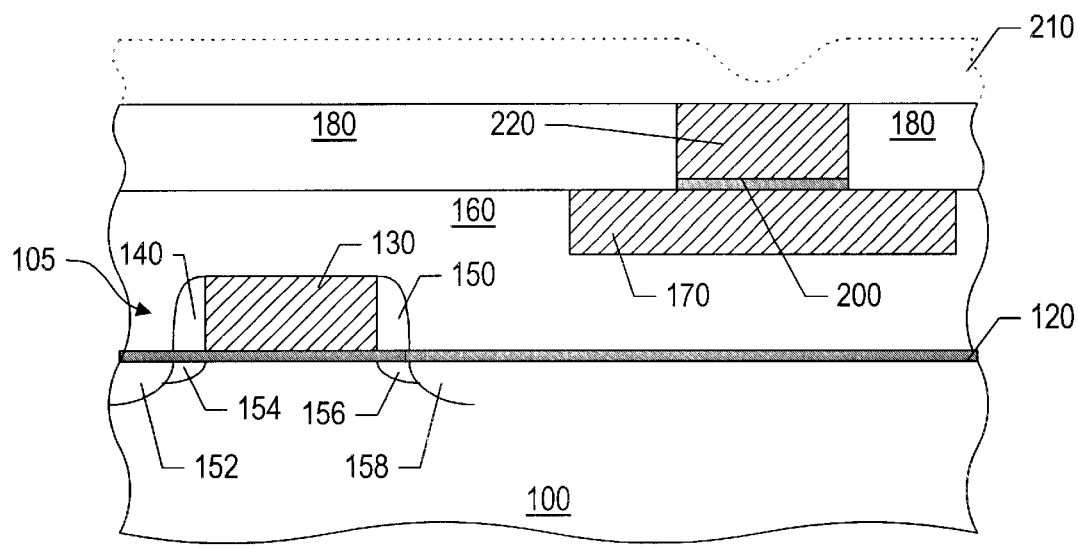
FIG. 5 is a partial cross-sectional view of a semiconductor substrate according to a processing step subsequent to FIG. 4, wherein a gate conductor is formed upon the gate dielectric by depositing polysilicon.

Turning now to FIG. 5, polysilicon 210 is deposited within the formed trench, exterior to the trench, and upon the upper surface of interlevel dielectric 180. Subsequent to deposition, any polysilicon exterior to the trench is removed using CMP. After partial removal, gate conductor 220 has a substantially planar upper surface. Gate conductor 220 has substantially vertical sidewall surfaces. This is a result of anisotropically etching polish-stop layer 180 instead of anisotropically etching polysilicon, which is the conventional method of fabricating the gate conductor. Substantially vertical sidewall surfaces are critical since the length of the channel is defined by the width of the gate. In submicron devices, the length of the channel significantly affects the properties of the device. Furthermore, the current density increases if the width of the gate decreases. Having substantially vertical sidewalls, ensures uniform gate width and uniform gate density throughout the gate conductor. Polish-stop layer 180 may then be removed using a wet etch or plasma etch. If polish-stop layer 180 comprises nitride, a plasma etch is preferably used to remove the layer. If polish-stop layer 180 comprises silicon dioxide, various hydrofluoric solutions may be used.

Figure 6:
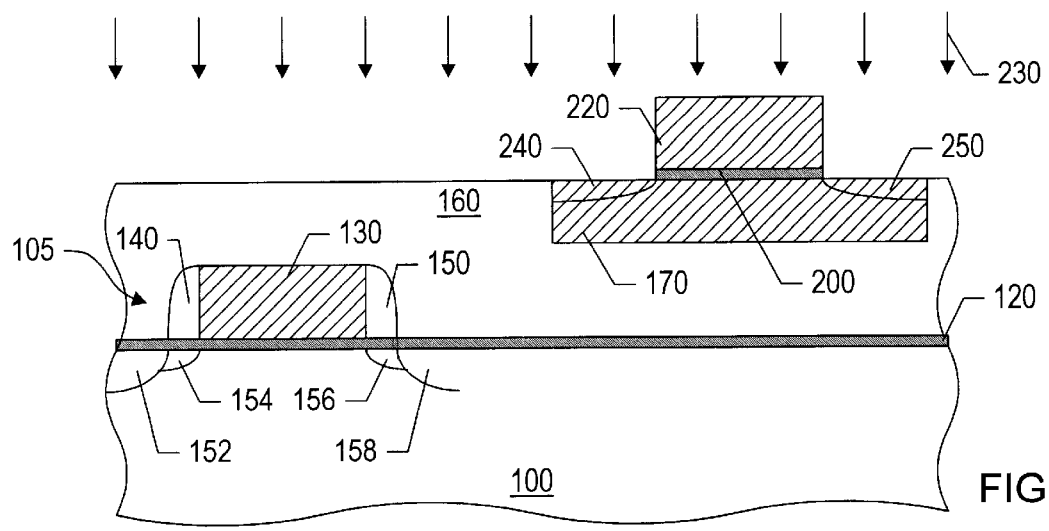
FIG. 6 is partial cross-sectional view of a semiconductor substrate according to a processing step subsequent to FIG. 5, wherein lightly-doped regions of the source/drain portions of the second transistor are formed by ion implantation.

Turning now to FIG. 6, dopants 230 are introduced into gate conductor 220 and the source/drain regions on either side of gate conductor 220. If an n-type transistor is to be manufactured dopants 230 preferably comprise arsenic or phosphorous. If a p-type transistor is to be manufactured, dopants 230 preferably comprise boron. A low concentration of dopants 230 is first implanted to form lightly-doped portions 240 and 250 of the source/drain regions.

Figure 7:
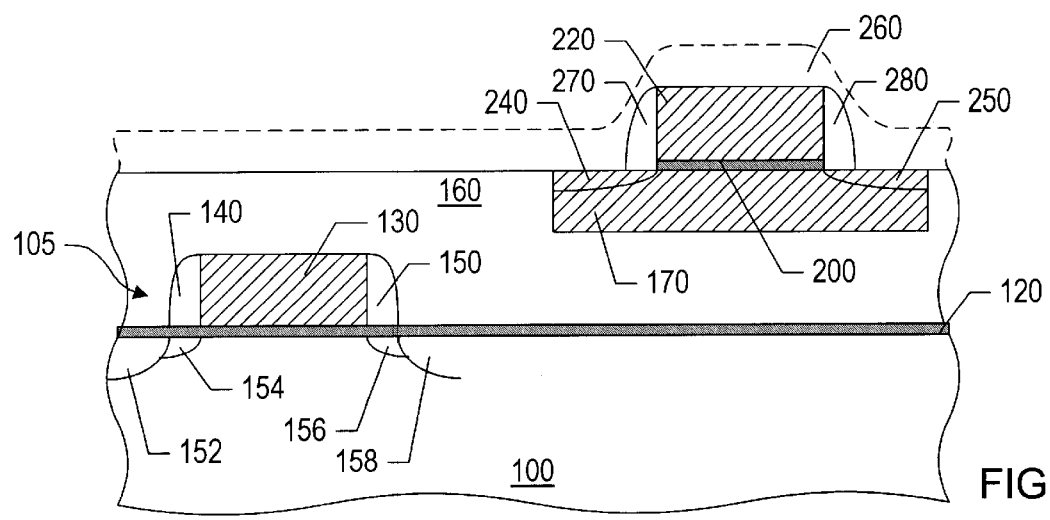
FIG. 7 is partial cross-sectional view of a semiconductor substrate according to a processing step subsequent to FIG. 6, wherein spacers are formed upon the sidewall surfaces of the second gate conductor.

Turning now to FIG. 7, conformal layer 260 is deposited upon the semiconductor topography. Conformal layer 260 preferably comprises TEOS deposited using a CVD process. Conformal layer 260 is subsequently anisotropically etched, preferably using a plasma etch process with a minimum overetch. By using an anisotropic etch and minimizing the overetch, spacer structures 270 and 280 are formed upon the sidewall surfaces of second gate conductor 220.

Figure 8:
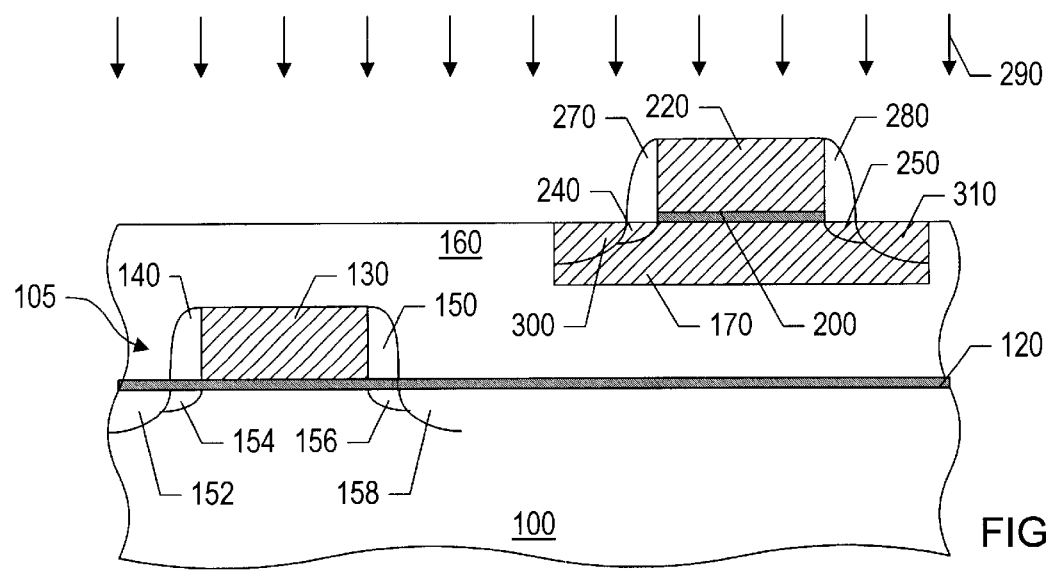
FIG. 8 is a partial cross-sectional view of a semiconductor substrate according to a processing step subsequent to FIG. 7, wherein highly-doped portions of the source/drain regions of the second transistor are formed by ion implantation.

Turning now to FIG. 8, a high concentration of dopants 290 is introduced into gate conductor 220 and the source/drain regions on either side of it. Highly doped portions 300 and 310 of the source/drain regions are formed as a result of the ion implantation. If an n-type transistor is to be formed, dopants 290 preferably comprise arsenic or phosphorous. If a p-type transistor is to formed, dopants 290 preferably comprise boron.

It will be appreciated to those skilled in the art having the benefit of this disclosure that this invention is believed to be capable of producing a more closely packed integrated circuit by manufacturing an elevated transistor. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An integrated circuit, comprising:
   a first gate conductor dielectrically spaced above a single crystal silicon substrate;
   a single interlevel dielectric layer extending over and upon the first gate conductor and the single crystal silicon substrate, wherein the interlevel dielectric is a single dielectric layer devoid of definite internal interfaces;
   a polysilicon substrate formed within a region of the interlevel dielectric spaced a vertical distance above and a lateral distance from the first gate conductor; and
   a second gate conductor arranged a dielectrically spaced distance above the polysilicon substrate.

2. The integrated circuit of claim 1, further comprising a pair of junction regions aligned within the polysilicon substrate on opposite sides of the second gate conductor.

3. The integrated circuit of claim 2, wherein the pair of junction regions each comprise a lightly doped portion and a highly doped portion.

4. The integrated circuit of 1, wherein the single interlevel dielectric layer comprises chemical vapor deposited tetraethyl orthosilicate or silane.

5. The integrated circuit as recited in claim 1, wherein the single interlevel dielectric layer comprises boron or phosphorus.

6. The integrated circuit as recited in claim 1, wherein the first gate conductor and the single crystalline silicon substrate are separated by an oxide that is thermally grown to a thickness of approximately 15 to 50 angstroms.

7. The integrated circuit as recited in claim 1, wherein the interlevel dielectric layer is deposited in a single step.

* * * * *